United States Patent

Kurihara et al.

[11] Patent Number: 5,995,011
[45] Date of Patent: Nov. 30, 1999

[54] VOLTAGE MONITORING CIRCUIT AND VOLTAGE MONITORING METHOD WITH HYSTERESIS CHARACTERISTIC

[75] Inventors: Yasunori Kurihara, Fukuoka; Hiroshi Sakata, Tokyo, both of Japan

[73] Assignee: Mitsubishi Denki Kabushiki Kaisha, Tokyo, Japan

[21] Appl. No.: 09/032,800

[22] Filed: Mar. 2, 1998

[30] Foreign Application Priority Data

Aug. 22, 1997 [JP] Japan ................................. 9-225936

[51] Int. Cl.$^6$ ................................................. G08B 21/00
[52] U.S. Cl. .......................... 340/663; 340/661; 340/662; 327/72; 327/74
[58] Field of Search .................................... 340/660, 661, 340/662, 663; 327/50, 56, 72, 73, 74; 323/207, 284, 299, 313

[56] References Cited

U.S. PATENT DOCUMENTS

| | | | |
|---|---|---|---|
| 4,613,770 | 9/1986 | Raab | 327/74 |
| 4,951,171 | 8/1990 | Tran et al. | 340/663 |
| 4,980,791 | 12/1990 | Alberkrack et al. | 340/663 |
| 5,390,068 | 2/1995 | Schultz et al. | 361/95 |
| 5,668,465 | 9/1997 | May | 340/663 |

*Primary Examiner*—Jeffery A. Hofsass
*Assistant Examiner*—Van T. Trieu
*Attorney, Agent, or Firm*—Oblon, Spivak, McClelland, Maier & Neustadt, P.C.

[57] ABSTRACT

A comparison circuit (4) is formed by a Schmidt buffer (4a) which has first and second threshold values and a buffer (4b) whose threshold value is larger than the first threshold value but smaller than the second threshold value. An integrating circuit (3) and the comparison circuit (4) function as a timer circuit which operates in accordance with comparison of the three values. An input signal (IN) decreases from a reference voltage signal (V6). A control signal becomes an H level after a time which is determined by a time constant of the integrating circuit (3) and the threshold value of the buffer (4b), and a detect signal (FO) is outputted after a time which corresponds to a difference between the second threshold value and the threshold value (which is equal to or shorter than a response time of the circuit (4)). During monitoring of a d.c. voltage which is applied to a drive circuit of a semiconductor element by means of a hysteresis operation, chattering of the detect signal is prevented which otherwise occurs despite an unstable hysteresis operation within a monitoring circuit when the d.c. voltage varies above and below a set value in a short period of time.

7 Claims, 5 Drawing Sheets

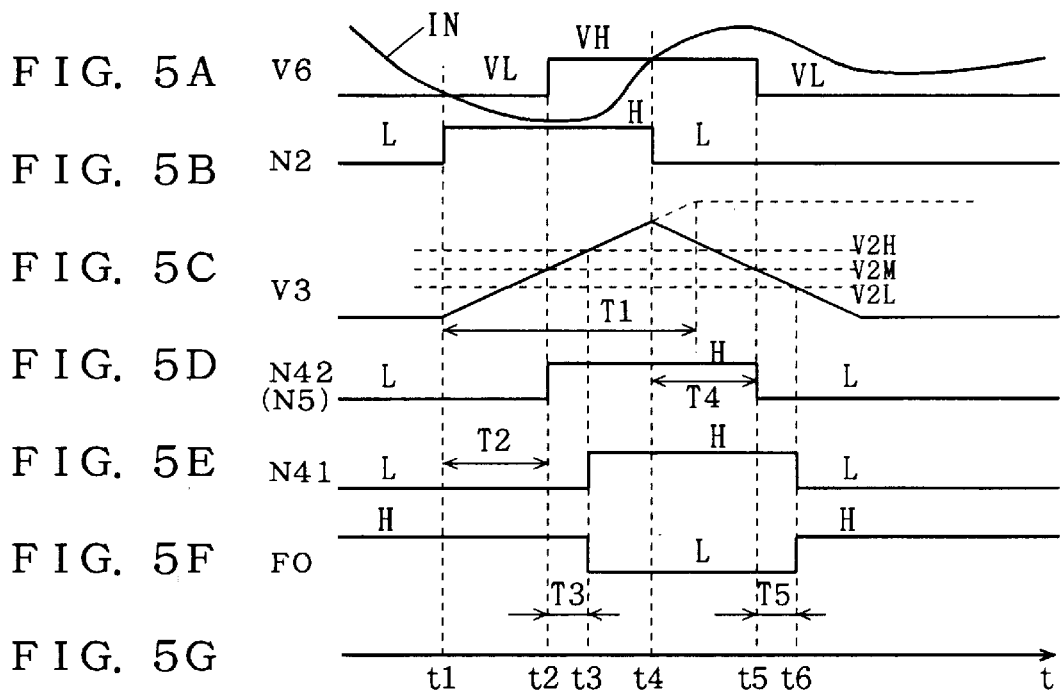
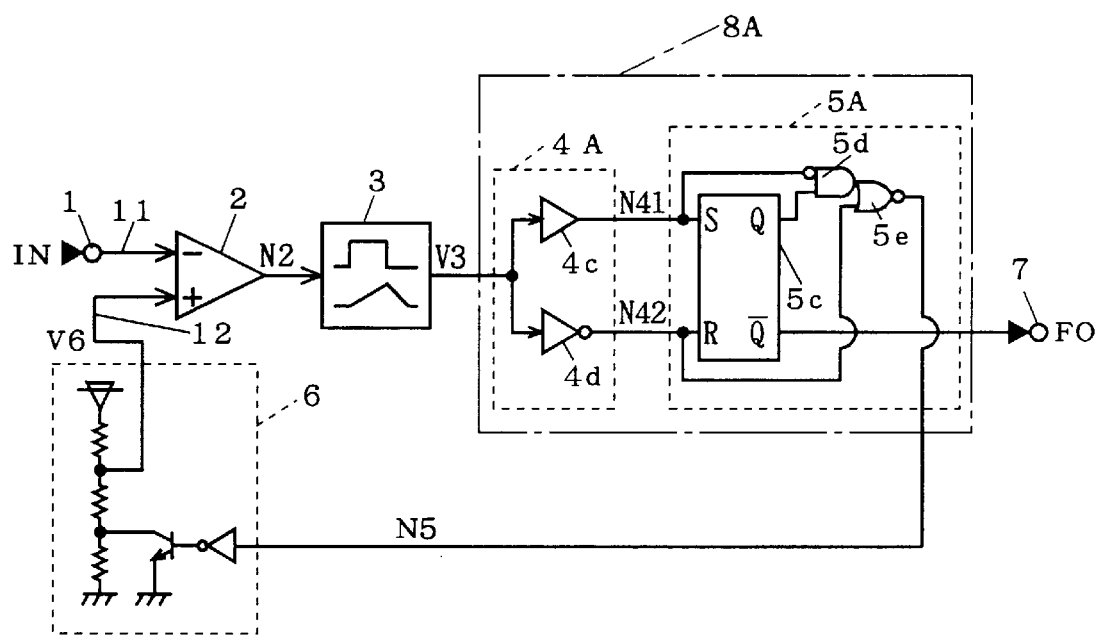

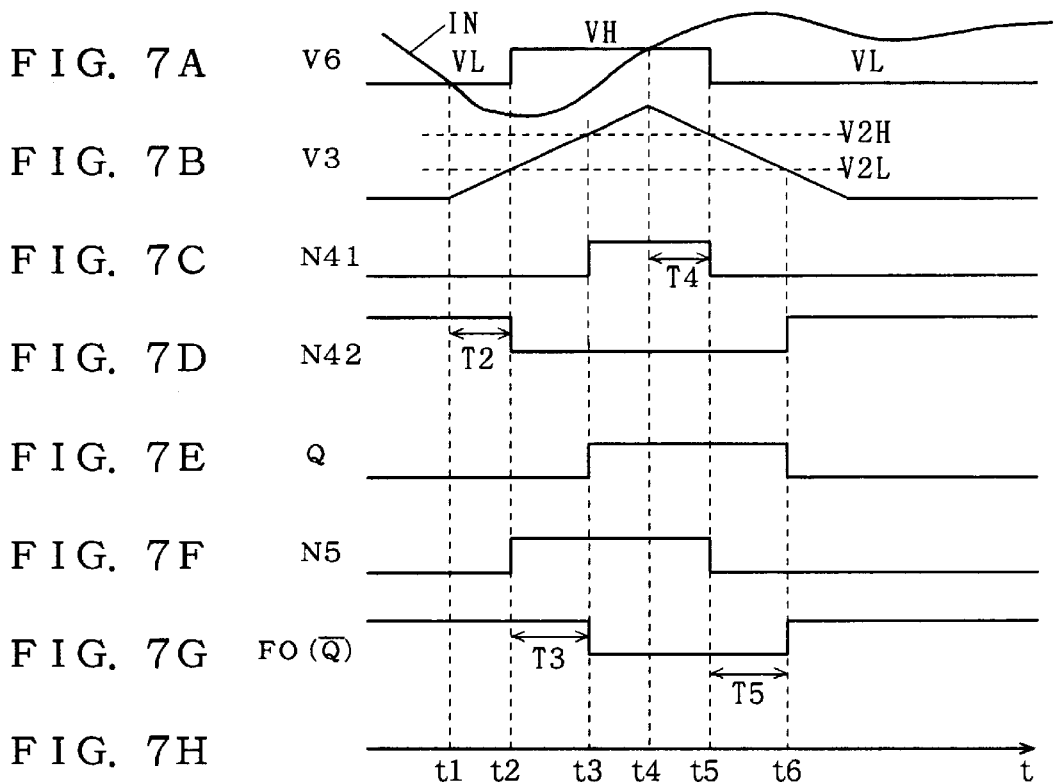
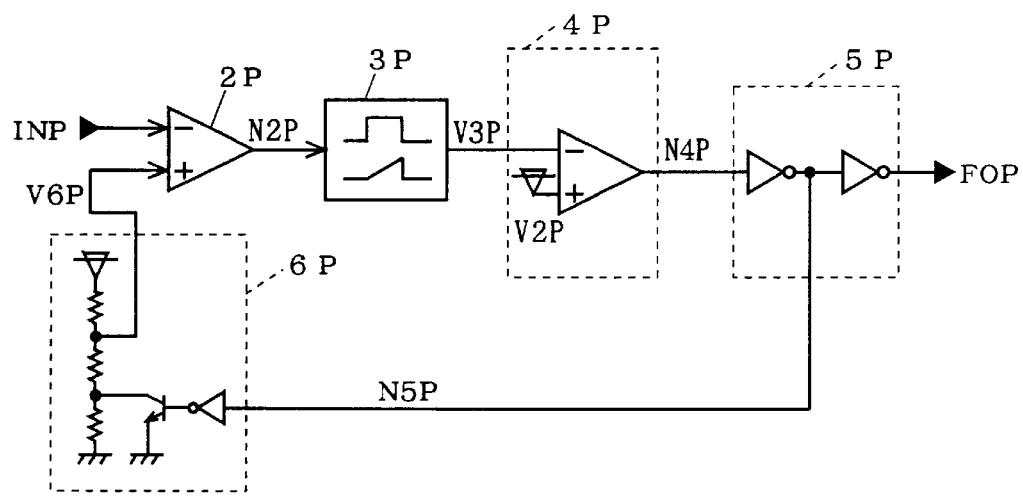

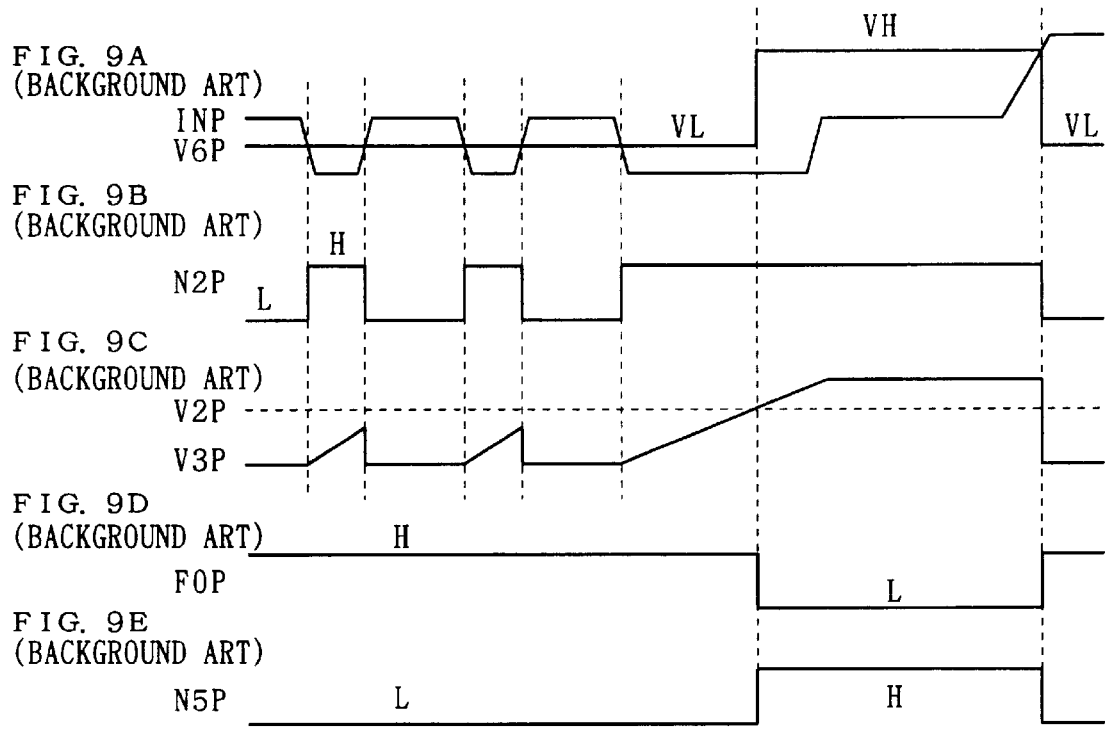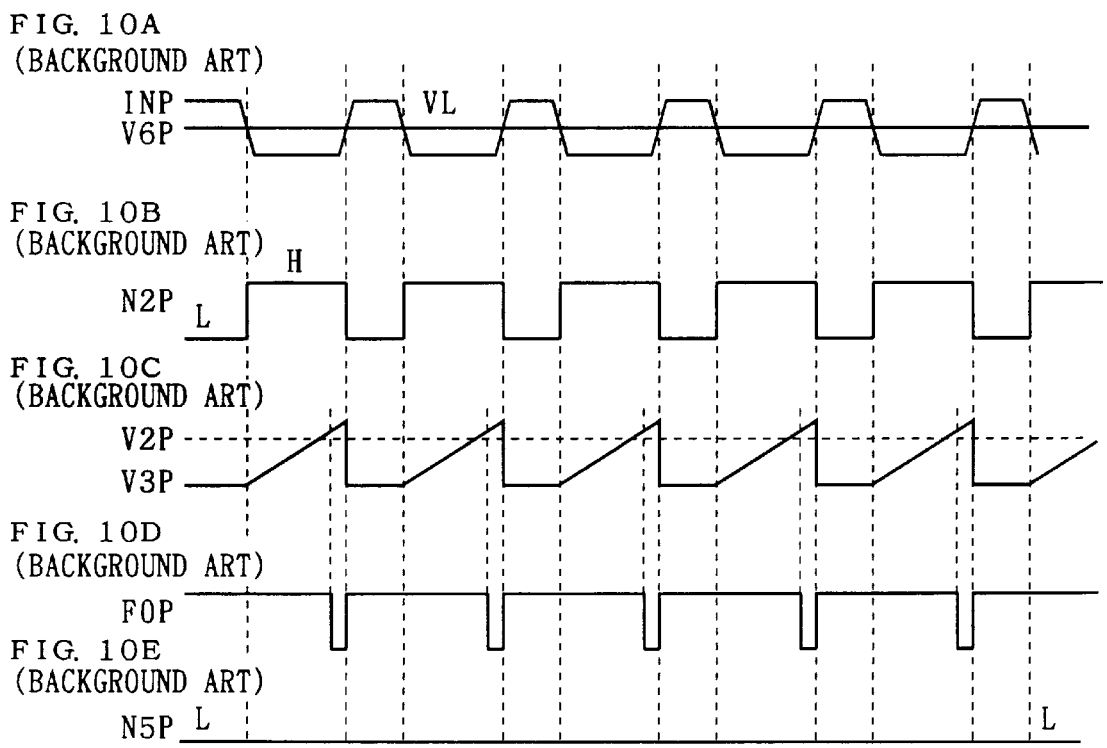

VOLTAGE MONITORING CIRCUIT AND VOLTAGE MONITORING METHOD WITH HYSTERESIS CHARACTERISTIC

BACKGROUND OF THE INVENTION

1. Field of the Invention

The present invention is related to a voltage monitoring apparatus which monitors a d.c. voltage and detects a condition of an apparatus from a change in the voltage. The present invention is appropriately applied to a technique for detecting a condition of a power source voltage of a drive circuit device which drives a power device and for accordingly controlling the device, for example.

2. Description of the Background Art

FIG. 8 is a block diagram showing one example of a conventional voltage monitoring circuit. FIGS. 9A to 9E are timing charts showing an operation of the circuit which is shown in FIG. 8.

In the voltage monitoring apparatus which is shown in FIG. 8, a certain voltage set value VL and a voltage set value VH which is higher than the voltage set value VL are alternately set as the level of a reference voltage signal V6 so that a hysteresis operation is performed and a condition of an external apparatus to the voltage monitoring apparatus is accordingly controlled. When a d.c. voltage input signal INP drops lower than the voltage set value VL, the apparatus detects a drop in the d.c. voltage and provides an external apparatus which uses the d.c. voltage as a power source voltage with a detect signal FOP which is indicative of an abnormal condition of the power source voltage. In this case, the voltage monitoring apparatus maintains a current condition in response to an instantaneous drop such as a power source noise (without outputting the detect signal FOP). The voltage monitoring apparatus outputs the detect signal FOP which detects a voltage drop in a d.c. power source only when such a condition continues that the d.c. voltage input signal INP becomes lower than the voltage set value VL only during a certain period of time or longer. Further, outputting the detect signal FOP, the voltage monitoring apparatus executes a hysteresis operation that the detect signal FOP will not be outputted in a normal condition unless the d.c. voltage input signal INP rises up to the voltage set value VH.

First, in FIGS. 8 and 9A to 9E, in a normal condition, a reference voltage generating circuit 6P outputs a reference voltage signal V6P which has the voltage set value VL which is low. A comparison circuit 2P compares a d.c. voltage of the d.c. voltage input signal INP with the voltage set value VL of the reference voltage signal V6P. In this case, since the d.c. voltage of the d.c. voltage input signal INP is higher than the voltage set value VL, the comparison circuit 2P outputs an output signal 2P having an L level. An integrating circuit 3P is in a state of integrating in a negative direction, when the comparison circuit 2P outputs an output signal N2P which has the L level, and therefore, is constant with the minimum potential and outputs an output signal V3P which has the minimum level. The output signal V3P from the integrating circuit 3P is supplied to one input terminal of a comparison circuit 4P. The comparison circuit 4P is a comparison element with a voltage set value V2P at the other input terminal of the comparison circuit 4P, and is formed by a comparator or an inverter whose threshold value is V2P. When a level of the output signal V3P from the integrating circuit 3P is then minimum potential, since the level of the output signal V3P is lower than the voltage set value V2P, the comparison circuit 4P outputs an output signal N4P which has an H level. In accordance with a result of the output signal N4P from the comparison circuit 4P, a control circuit 5P outputs a control signal N5P which allows the voltage generating circuit 6P to output the voltage set value VL. As a result, until a level of the d.c. voltage input signal INP becomes equal to or lower than the voltage set value VL, a current normal operation is maintained. At this stage, the level of the detect signal FOP is the H level.

In a condition where the d.c. voltage level of the d.c. voltage input signal INP drops, an output from the voltage generating circuit 6P is the reference voltage signal V6P which has the voltage set value VL which is low. When the d.c. voltage level of the d.c. voltage input signal INP becomes lower than the voltage set value VL, the comparison circuit 2P outputs the output signal N2P which has the H level. As a result, the integrating circuit 3P enters a state of integrating in a positive direction upon receipt of the output signal N2P which has the H level from the comparison circuit 2P, and a potential of the output signal V3P outputted from the integrating circuit 3P starts to increase. The output signal V3P outputted from the integrating circuit 3P is compared with the voltage set value V2P outputted from the comparison circuit 4P, and from a point of time at which the level of the output signal V3P becomes equal to or larger than the voltage set value V2P, a portion composed of the integrating circuit 3P and the comparrison ciruit 4P serves as a timer circuit. If the level of the d.c. voltage input signal INP exceeds the set value VL of the comparison circuit 2P before the output signal V3P outputted from the integrating circuit 3P becomes equal to the voltage set value V2P outputted from the comparison circuit 4P, the comparison circuit 2P outputs the output signal N2P which has the L level, and therefore, the integrating circuit 3P is reset so that the output signal V3P returns to the minimum level again. Hence, the value to which the reference voltage signal V6P is set remains the set value VL.

Conversely, when the level of the d.c. voltage input signal INP becomes lower than the set value VL over a period of time which is set by the timer circuit described above, through the operation described above, the output signal V3P from the integrating circuit 3P becomes higher than the voltage set value V2P outputted from the comparison circuit 4P, so that the comparison circuit 4P outputs the output signal N4P which has the L level. When the output signal N4P from the comparison circuit 4P becomes the L level, the control circuit 5P outputs the control signal N5P which allows the voltage generating circuit 6P to set an output voltage from the voltage generating circuit 6P to the set value VH. It then follows that the comparison circuit 2P compares against the voltage set value VH which is high. This condition is maintained until the level of the d.c. voltage input signal INP becomes equal to or larger than the voltage set value VH. At this stage, the level of the detect signal FOP is the L level.

As can be understood from the foregoing, this apparatus functions as a hysteresis circuit which operates in response to a change amounting to or over the threshold value which is determined by the voltage set values VH and VL of the comparison circuit 2P and a change amounting to or over a time which is determined by an integrating coefficient and the voltage set value V2P, and outputs the detect signal FOP to outside.

The invention described in Japanese Patent Application Laid-Open Gazette No. 63-313077 discloses to form a timer circuit with an RC integrating circuit and a comparator with a hysteresis characteristic, which is formed by a Schmidt circuit whose one of input terminals is connected to its output terminal, and discloses a circuit which monitors a level of an input d.c. power source. Meanwhile, the invention described in Japanese Patent Application Laid-Open Gazette No. 63-315963 discloses a comparator circuit which has a hysteresis characteristic and a timer circuit portion which is connected to an output terminal of the comparator circuit.

However, in a conventional voltage monitoring circuit as that shown in FIGS. 8 and 9A to 9E which comprises a timer circuit which filters out a variation in an inputted d.c. voltage while using a time which is determined by an integrating coefficient of an integrating circuit and one set voltage of a comparator, the following problems have been addressed.

FIGS. 10A to 10E show operation timing of the circuit shown in FIG. 8 which has problems. A case is assumed where the d.c. voltage input signal INP varies beyond or below the set value VL in approximately the same cycle as a time which is determined by the integrating circuit 3P and the set value V2P of the comparison circuit 4P as shown in FIGS. 10A to 10C. In such a case, although the comparison circuit 4P outputs the H-level output signal N4P which has a short duration time, if the duration time of the output signal N4P is equal to or shorter than a time (response width) in which the elements of the control circuit 5P and the voltage generating circuit 6P are responsive, since the voltage generating circuit 6P can not change the set value VL to the high potential set value VH, the voltage monitoring apparatus itself repeats the same operation. On the other hand, when the logic of the control circuit 5P for creating the detect signal is responsive during the duration of the H level of the output signal N4P of the comparison circuit 4P, the detect signal FOP changes to the L level in synchronization to the cycle of the d.c. voltage input signal INP. As a result, the detect signal FOP chatters or oscillates. However, although the detect signal FOP externally indicates a drop in the d.c. voltage, as an internal operation of the voltage monitoring apparatus, a hysteresis operation is not indicated which corresponds to such a drop in the power source voltage. Hence, this disagreement adversely affects an external circuit which operates in accordance with the condition of the detect signal FOP.

Thus, in the conventional voltage monitoring apparatus, since delayed responses of the elements which form the voltage monitoring apparatus are not considered at all, although the apparatus can not invoke a hysteresis operation as the elements can not follow a change in the inputted d.c. voltage due to the delayed responses, the detect signal alone chatters, so that the change in the apparatus may be transmitted to outside the apparatus.

SUMMARY OF THE INVENTION

A first aspect of the present invention is directed to a voltage monitoring apparatus which has a hysteresis characteristic, comprising: a comparison circuit comparing a d.c. voltage supplied from outside with a reference voltage, the comparison circuit outputting an output signal of a first level when the d.c. voltage is equal to or higher than the reference voltage, the comparison circuit outputting the output signal of a second level when the d.c. voltage is lower than the reference voltage; an integrating circuit which starts integrating when the comparison circuit starts outputting the output signal of the second level, keeps integrating as long as the comparison circuit outputs the output signal of the second level, and clamps an output signal of the integrating circuit which is in the process of increasing at a predetermined level; a control signal/detect signal generating circuit having at least a first set level and a second set level as reference levels, the control signal/detect signal generating circuit comparing the output signal from the integrating circuit which is in the process of increasing with the reference levels, and outputting a control signal of a third level (a) when the output signal from the integrating circuit is smaller than the first set level, outputting the control signal of a fourth level (b) when the output signal from the integrating circuit becomes equal to the first set level, outputting a detect signal which indicates a decrease in the d.c. voltage as information to outside (c) when the output signal from the integrating circuit becomes equal to the second set level; and a reference voltage generating circuit receiving the control signal, the reference voltage generating circuit keeping a level of the reference voltage set to a fifth level upon receipt of the control signal of the third level, the reference voltage generating circuit setting the level of the reference voltage to a sixth level which is higher than the fifth level upon receipt of the control signal of the fourth level; wherein a relationship (the predetermined level)>(the second set level)>(the first set level) and a relationship (the second set level—the first set level)≧(a level corresponding to a response time of the reference voltage generating circuit) hold.

(a) An integrated result is not supplied to the control signal/detect signal generating circuit when the integrating circuit does not execute the integrating operation, that is, when the integrating circuit does not output the output signal, and therefore, the control signal/detect signal generating circuit sets a level of the control signal to the third level so that the control signal is outputted at the first output terminal of the control signal/detect signal generating circuit to the reference voltage generating circuit. In response to this, the reference voltage generating circuit sets a level of the reference voltage to the fifth level. Hence, in this case, the comparison circuit judges whether a level of the d.c. voltage is lower than the fifth level of the reference voltage.

When the d.c. voltage≧the fifth level, the comparison circuit outputs the output signal of the first level, and therefore, the integrating circuit does not execute the integrating operation. Hence, a level of the reference voltage is kept at the fifth level, so that the control signal/detect signal generating circuit never outputs the detect signal.

Now, if the d.c. voltage decreases below the fifth level, the output from the comparison circuit changes to the second level, so that the integrating circuit starts executing the integrating operation and the output signal from the integrating circuit starts to increase. Receiving the output signal from the integrating circuit which has started to increase as the input signal, the control signal/detect signal generating circuit compares a level of the output signal from the integrating circuit with the first set level. At this stage, as far as (the output signal from the integrating circuit)<(the first set level) holds, the control signal/detect signal generating circuit keeps the level of the control signal set to the third level as before. This keeps the level of the reference voltage at the fifth level as before.

(b) Now, it is assumed that the increasing output signal from the integrating circuit becomes equal to the first set level. At this stage, the control signal/detect signal generating circuit changes the level of the control signal from the third level to the fourth level, and outputs the control signal of the fourth level to the input terminal of the reference voltage generating circuit. In response to this, the reference voltage generating circuit changes a level of the reference voltage from the fifth level to the higher sixth level. As a result, from this point and onward, the judgement reference voltage of the comparison circuit remains at the sixth level which is high. This realizes a hysteresis operation. Thus, the reference voltage of the comparison circuit is changed to the sixth level, if the output signal from the integrating circuit keeps increasing even after a time which is needed for the integrated result to reach the first set level (i.e., the second period) since detection of a decrease in the d.c. voltage against the reference voltage of the comparison circuit which is set to the fifth level.

(c) It is assumed that the output signal from the integrating circuit keeps further increasing and arrives at the second set level after the third period since the second period. In this case, during a period which is defined as the sum of the second and the third periods, the d.c. voltage supplied from outside always remains below the reference voltage of the comparison circuit. If such a condition of a drop in the d.c. voltage continues, the continued condition is recognized as a change in a condition by an external apparatus which uses the d.c. voltage as a drive power source. Further, a difference between the second set level and the first set level is set to be equal to or higher than a level which corresponds to a time which is necessary for the reference voltage generating circuit to change the level of the reference voltage in response to a change in the level of the control signal, i.e., the response time of the reference voltage generating circuit. Hence, even if the control signal/detect signal generating circuit outputs the detect signal to outside at this point, a hysteresis operation has already been completed within the voltage monitoring apparatus without fail, which therefore guarantees a stable hysteresis operation. In this case, since the detect signal is not outputted even if the d.c. voltage increases once again to be equal to or higher than the reference voltage before the third period after the second period, it is possible to prevent chattering of the detect signal which would otherwise occur.

As described above, according to the first aspect of the present invention, (1) it is possible to execute a hysteresis operation without fail in a stable manner after the d.c. voltage becomes lower than the reference voltage of the comparison circuit, while preventing chattering or oscillation of the detect signal, and (2) it is possible to output the detect signal without fail which is supposed to be transmitted to an external apparatus as a signal which indicates a decrease in the d.c. voltage.

According to a second aspect of the present invention, in the voltage monitoring apparatus of the first aspect, the control signal/detect signal generating circuit comprises: a first comparator whose input terminal is connected to an output terminal of the integrating circuit, the first comparator having the first set level as a judgement reference voltage, the first comparator comparing the output signal from the integrating circuit with the first set level; a second comparator whose input terminal is connected to an output terminal of the integrating circuit, the second comparator having the second set level as a judgement reference voltage, the second comparator comparing the output signal from the integrating circuit with the second set level; and a logic circuit whose input terminal is connected to an output terminal of the first comparator and an output terminal of the second comparator, the logic circuit generating and outputting the control signal and the detect signal based on output signals from the first comparator and the second comparator.

According to the second aspect, since the control signal/detect signal generating circuit is formed by the two comparators and the logic circuit, it is possible to realize the function of the control signal/detect signal generating circuit using general-purpose logic elements of a small size. This makes it possible to complete the voltage monitoring apparatus as a general-purpose IC of a small size.

According to a third aspect of the present invention, in the voltage monitoring apparatus of the second aspect, the second comparator comprises a Schmidt circuit which has the second set level and a third set level which is lower than the first set level as the judgement reference voltage, and the logic circuit outputs the detect signal lased on the output signal from the first comparator but outputs the control signal based on the output signal from the second comparator.

According to the third aspect, the comparison circuit is formed by the second comparator which comprises the Schmidt circuit and the first comparator such as a buffer. This allows the present invention to exhibit a function as a timer or filtering circuit which compares three values, so that it is possible to complete a stable and reliable hysteresis operation without causing the detect signal to chatter at all.

In other words, (a) when (the output signal from the integrating circuit)<the first set level, since levels which are compared at both the first and the second comparators are lower than the judgement reference level, the control signal remains at the third level, and therefore, the detect signal is not outputted. (b) When the first set level≦(the increasing output signal from the integrating circuit)<the second set level, while the output from the second comparator remains the same as in the condition (a), a level of the output from the first comparator reverses, and therefore, the logic circuit outputs the control signal having the fourth level so that the reference voltage of the comparator is at the sixth level which is high. (c) When the second set level≦(the output signal from the integrating circuit)≦(the predetermined clamp level) where the d.c. voltage is lower than the reference voltage, the output from the second comparator also reverses, and hence, the logic circuit accordingly outputs the detect signal. In this case, since the level of the output from the first comparator remains unchanged, the logic circuit maintains the control signal at the fourth level. (d) As the d.c. voltage becomes higher than the reference voltage and when the accordingly decreasing output signal from the integrating circuit becomes the second set level, the output from the first comparator reverses, so that the control signal immediately returns to and remains at the third level. This causes the reference voltage of the comparator to return to the fifth level. (e) As the output signal from the integrating circuit further decreases and when the output signal from the integrating circuit becomes the third set level, the output from the second comparator reverses, so that the logic circuit stops outputting the detect signal.

In this manner, the third aspect of the present invention guarantees a series of hysteresis operations that the reference voltage which used to be at the fifth level changes to the sixth level with a decrease in the d.c. voltage and the reference voltage returns to the fifth level again as the d.c. voltage increases and arrives at the range of the predetermined level (>the reference voltage), while ensuring reliable detection of a change in the d.c. voltage.

According to a fourth aspect of the present invention, in the voltage monitoring apparatus of the second aspect, the logic circuit changes a level of the control signal from the fourth level to the third level when the output signal from the integrating circuit, which starts decreasing when the d.c. voltage becomes equal to the reference voltage which is set to the sixth level, becomes equal to the second level, and stops outputting the detect signal when the output signal from the integrating circuit which further keeps decreasing becomes equal to the first set level.

According to the fourth aspect, since the first and the second comparators can be realized with specific and available elements such as a buffer and an inverter, the fourth aspect of the present invention can function as a timer or filtering circuit which compares two values, so that it is possible to output the detect signal stably and accurately without chattering the detect signal but in accordance with execution of a hysteresis operation within the voltage monitoring apparatus.

In short, (d) the output signal from the integrating circuit starts to decrease from the predetermined clamp level as the d.c. voltage becomes equal to or higher than the reference voltage, and when the output signal arrives at the second set level, only the output from the second comparator reverses again, so that the control signal returns to the third level and a hysteresis operation is accordingly completed. (e) The output from the first comparator reverses after the output signal from the integrating circuit further decreases to the first set level, outputting of the detect signal is stopped accordingly late. In this manner, confirming recovery of the hysteresis operation to the fifth level without fail, the apparatus of the fourth aspect stops externally outputting the detect signal.

A fifth aspect of the present invention is directed to a voltage monitoring apparatus which has a hysteresis characteristic, comprising: a first input signal line which transmits a d.c. voltage supplied from outside as a first input signal; a second input signal line which transmits a reference voltage as a second input signal; a comparison circuit whose input terminal is connected to one ends of the first input signal line and the second input signal line, the comparison circuit outputting an output signal of a first level at an output terminal of the comparison circuit when the d.c. voltage is equal to or higher than the reference voltage, the comparison circuit outputting the output signal of a second level at the output terminal of the comparison circuit when the d.c. voltage is lower than the reference voltage; an integrating circuit which starts an integrating operation when the comparison circuit starts outputting the output signal of the second level, the integrating circuit keeps executing the integrating operation while the comparison circuit keeps outputting the output signal of the second level, the integrating circuit clamping an output signal of the integrating circuit which is in the process of increasing at a predetermined level after a first period since the start of the integrating operation; a control signal/detect signal generating circuit whose input terminal is connected to an output terminal of the integrating circuit, (a) the control signal/detect signal generating circuit outputting a control signal of a third level at a first output terminal of the control signal/detect signal generating circuit when the output signal of the integrating circuit is not received, (b) upon receipt of the output signal of the integrating circuit, the control signal/detect signal generating circuit continuing to output the control signal of the third level at the first output terminal when an increase in the output signal of the integrating circuit is not detected after a second period since the receipt of the output signal of the integrating circuit, but outputting the control signal of a fourth level at the first output terminal when the increase in the output signal of the integrating circuit is detected even after the second period since the receipt of the output signal of the integrating circuit, (c) the control signal/detect signal generating circuit outputting a detect signal, which indicates a decrease in the d.c. voltage as information to outside, at a second output terminal of the control signal/detect signal generating circuit only when the increase in the output signal of the integrating circuit is detected even after a third period since the second period; and a reference voltage generating circuit whose input terminal is connected to the first output terminal of the control signal/detect signal generating circuit, an output terminal of the reference voltage generating circuit being connected to other end of the second input signal line, the reference voltage generating circuit keeping a level of the reference voltage set to a fifth level upon receipt of the control signal of the third level, the reference voltage generating circuit keeping the level of the reference voltage set to a sixth level which is higher than the fifth level upon receipt of the control signal of the fourth level; wherein a relationship (the first period)>(the second period+the third period) and a relationship (the third period)>(a response time of the reference voltage generating circuit) hold.

(a) An integrated result is not supplied to the control signal/detect signal generating circuit when the integrating circuit does not execute the integrating operation, that is, when the integrating circuit does not output the output signal, and therefore, the control signal/detect signal generating circuit sets a level of the control signal to the third level so that the control signal is outputted at the first output terminal of the control signal/detect signal generating circuit to the reference voltage generating circuit. In response to this, the reference voltage generating circuit sets a level of the reference voltage to the fifth level. Hence, in this case, the comparison circuit judges whether a level of the d.c. voltage is lower than the fifth level of the reference voltage.

When the d.c. voltage≧the fifth level, the comparison circuit outputs the output signal of the first level, and therefore, the integrating circuit does not execute the integrating operation. Hence, a level of the reference voltage is kept at the fifth level, so that the control signal/detect signal generating circuit never outputs the detect signal.

Now, if the d.c. voltage decreases below the fifth level, the output from the comparison circuit changes to the second level, so that the integrating circuit starts executing the integrating operation and the output signal from the integrating circuit starts to increase. Receiving the output signal from the integrating circuit which has started to increase as the input signal, the control signal/detect signal generating circuit compares a time elapsed since the output signal of the integrating circuit has started to increase with the second period. At this stage, if an increase in the output signal from the integrating circuit is not detected after the second period, the control signal/detect signal generating circuit keeps the control signal at the third level as before. This keeps the reference voltage at the fifth level as before.

(b) On the other hand, if an increase in the output signal from the integrating circuit is detected even after the second period, the control signal/detect signal generating circuit changes the control signal from the third level to the fourth level and outputs the control signal having the fourth level to the input terminal of the reference voltage generating circuit. In response to this, the reference voltage generating circuit changes a level of the reference voltage from the fifth level to the higher sixth level. As a result, from this point and onward, the judgement reference voltage of the comparison circuit remains at the sixth level which is high. This realizes a hysteresis operation. Thus, the reference voltage of the comparison circuit is changed to the sixth level, if the integrating operation is still being executed even after the second period since detection of a decrease in the d.c. voltage against the reference voltage of the comparison circuit which is set to the fifth level. It then follows that the control signal/detect signal generating circuit and the integrating circuit function as a timer circuit or a filtering circuit.

(c) It is assumed that the output signal from the integrating circuit keeps further increasing and the integrating operation is still continued even after the third period since the second period. In this case, during a period which is defined as the sum of the second and the third periods, the d.c. voltage supplied from outside always remains below the reference voltage of the comparison circuit. If such a condition of a drop in the d.c. voltage continues, the continued condition is recognized as a change in a condition by an external apparatus which uses the d.c. voltage as a drive power source. Further, the third period is set to be equal to or longer than a time which is necessary for the reference voltage generating circuit to change the level of the reference voltage in response to a change in the level of the control signal, i.e., the response time of the reference voltage generating circuit. Hence, even if the control signal/detect signal generating circuit outputs the detect signal to outside at this point, a hysteresis operation has already been completed within the voltage monitoring apparatus without fail, which therefore guarantees a stable hysteresis operation. In this case, since the detect signal is not outputted even if the d.c. voltage increases once again to be equal to or higher than the reference voltage before the third period after the second period, it is possible to prevent chattering of the detect signal which would otherwise occur.

As described above, according to the fifth aspect of the present invention, it is possible to execute a hysteresis operation without fail in a stable manner after the d.c. voltage becomes lower than the reference voltage of the comparison circuit, while preventing chattering of the detect signal, and it is further possible to output the detect signal reliably and stably following this.

According to a sixth aspect of the present invention, in the voltage monitoring apparatus of the fifth aspect, the control signal/detect signal generating circuit has a function of (d) changing a level of the control signal from the fourth level to the third level after a fourth period since arrival of the d.c. voltage at the reference voltage set to the sixth level, and a function of (e) stopping to output the detect signal after a fifth period since the fourth period, and a relationship (the first period)>(the fourth period+the fifth period) holds.

According to the sixth aspect, a level of the control signal returns to the third level from the fourth level within the fourth period since the arrival of the d.c. voltage at or over the reference voltage which is at the sixth level, and the detect signal is stopped after the fifth period since that point. Hence, it is possible to complete a series of hysteresis operations while controlling outputting of the detect signal.

A seventh aspect of the present invention is directed to a voltage monitoring method which has a hysteresis characteristic, comprising the steps of: comparing a d.c. voltage supplied from outside with a reference voltage having a first level; starting an integrating operation when the d.c. voltage which is higher than the reference voltage becomes equal to the reference voltage and continuing the integrating operation until a first period, which is necessary for an integrated value to reach a predetermined level, as long as the d.c. voltage is lower than the reference voltage; detecting whether an increase in the integrated value is continuing after a second period since the start of the integrating operation, continuing generation of a control signal of a third level as before the start of the integrating operation if the increase is not continuing, but changing a level of the control signal from the third level to fourth level if the increase is continuing; continuing to set a level of the reference voltage to the third level when the level of the control signal is at the third level, but setting the level of the reference voltage to a second level which is higher than to the first level when the level of the control signal is at the fourth level to thereby continue comparison of the d.c. voltage supplied from outside with the reference voltage and the integrating operation in accordance with a result of the comparison; and detecting whether the increase in the integrated value is continuing even after a third period since the second period, generating a detect signal, which indicates a decrease in the d.c. voltage as information to outside, if the increase is continuing and outputting the detect signal to outside, wherein a relationship (the first period)>(the second period+the third period) and a relationship (the third period) >(a response time in which the level of the reference voltage can be set in accordance with receipt of the control signal) hold.

According to the seventh aspect, it is possible to execute a hysteresis operation that a level of the reference voltage which is compared with the d.c. voltage is changed to the sixth level from the fifth level in accordance with a decrease in the d.c. voltage, separately from and always prior to the step of outputting the detect signal. Hence, it is possible to execute the hysteresis operation above reliably and stably while preventing chattering of the detect signal. It is further possible to externally output the detect signal after the hysteresis operation above is completed, as a condition which is supposed to be outputted.

Accordingly, an object of the present invention is to improve a conventional voltage monitoring apparatus and to ensure a stable hysteresis operation and stable outputting of a detect signal during monitoring an inputted d.c. voltage and a time in which the voltage changes to controlle an apparatus which uses the d.c. voltage as a power source voltage.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 5A to 5G are timing charts showing an operation of the circuit which is shown in FIG. 2;

FIG. 6 is a diagram showing a structure of a voltage monitoring apparatus according to a second preferred embodiment of the present invention;

FIGS. 7A to 7H are timing charts showing an operation of the circuit which is shown in FIG. 6;

FIG. 8 is a diagram showing a circuitry structure of a conventional voltage monitoring apparatus;

FIGS. 9A to 9E are diagrams showing operation timing of the conventional voltage monitoring apparatus; and FIGS. 10A to 10E are timing charts showing problems with the conventional voltage monitoring apparatus.

DESCRIPTION OF THE PREFERRED EMBODIMENTS

Figure 1:
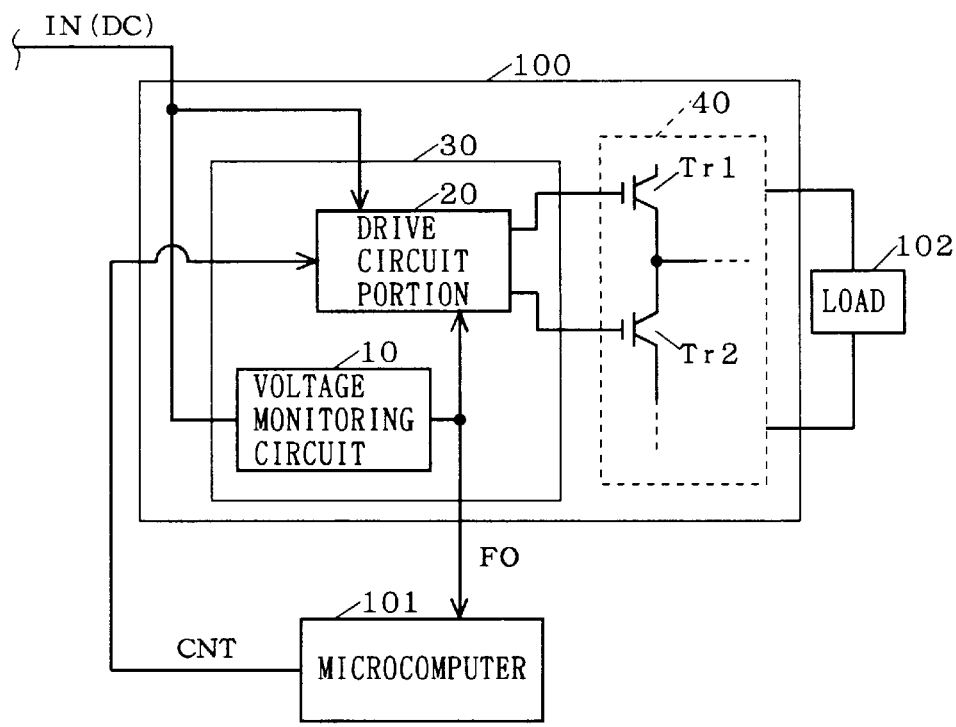
FIG. 1 is a block diagram showing an application of a voltage monitoring apparatus to a semiconductor device.

FIG. 1 is a block diagram schematically showing use of a voltage monitoring circuit 10 according to the present invention as a voltage monitoring apparatus for a semiconductor device product.

A power module 100, such as an intelligent power module (IPM), drives a load 102 such as a motor, under the control of an external microcomputer 101. To this end, the power module 100 comprises a portion 40, which is formed by power semiconductor elements Tr1, Tr2, etc., such as an IGBT and a power MOSFET, and a drive circuit 30 (which is formed as an IC) for generating a drive signal which is to be supplied to the power semiconductor elements Tr1, Tr2, etc. The circuit 30 includes a drive circuit portion 20 which serves as a main portion of the circuit 30, and the voltage monitoring circuit 10. The circuit 10 monitors a change in a d.c. voltage input signal IN(DC) which is supplied from outside to the drive circuit portion 20, namely, a change in a power source voltage. Detecting a condition that a d.c. voltage which is allowed by the signal IN is lower than a reference voltage which is set internally to the circuit 10 during or over a predetermined period of time, the circuit 10 provides the drive circuit portion 20 and the microcomputer 101 which is externally disposed with a result of the detection, as a detect signal FO, which is indicative of such a condition. The reference voltage itself is a value which is determined in accordance with unique specifications of each power module 100. The voltage monitoring circuit 10 is an important portion which monitors a change with time in a d.c. voltage which is externally generated by a commercial power source based on the unique specifications. Upon receipt of the detect signal FO, the microcomputer 101 sends out a signal CNT which stops an operation of the drive circuit portion 20, and thereby controls the circuit portion 20.

The foregoing is intended as a detailed introductory description on an application of the voltage monitoring apparatus of the present invention to a semiconductor device. Now, specific structure and operation of the voltage monitoring circuit 10 shown in FIG. 1 will be described in the following. A technical idea of the present invention in the voltage monitoring circuit 10 is realized as first and second preferred embodiments. The first and second preferred embodiments both employ a method that a plurality of set values for comparison (judgement reference voltages) are set to a comparison circuit which is formed within a timer circuit or a filtering circuit of a voltage monitoring circuit which has a hysteresis characteristic to thereby solve the problems described earlier that a delayed response of an element which forms the voltage monitoring circuit prohibits activation of a hysteresis operation but instead causes chattering of a detect signal. The first preferred embodiment, in particular, is characterized in that a comparison circuit which is formed within the timer circuit described above is formed as a comparator which has three set values for comparison. The second preferred embodiment is characterized in that the comparison circuit is formed as comparator which has two set values for comparison.

First Preferred Embodiment

In a voltage monitoring apparatus according to the first preferred embodiment, the comparison circuit which is formed within the timer circuit portion is formed by a Schmidt circuit and an inverter whose threshold value is between the largest threshold value and the smallest threshold value of the Schmidt circuit. Now, the voltage monitoring apparatus will be described specifically in more detail, while referring to associated drawings.

Figure 2:
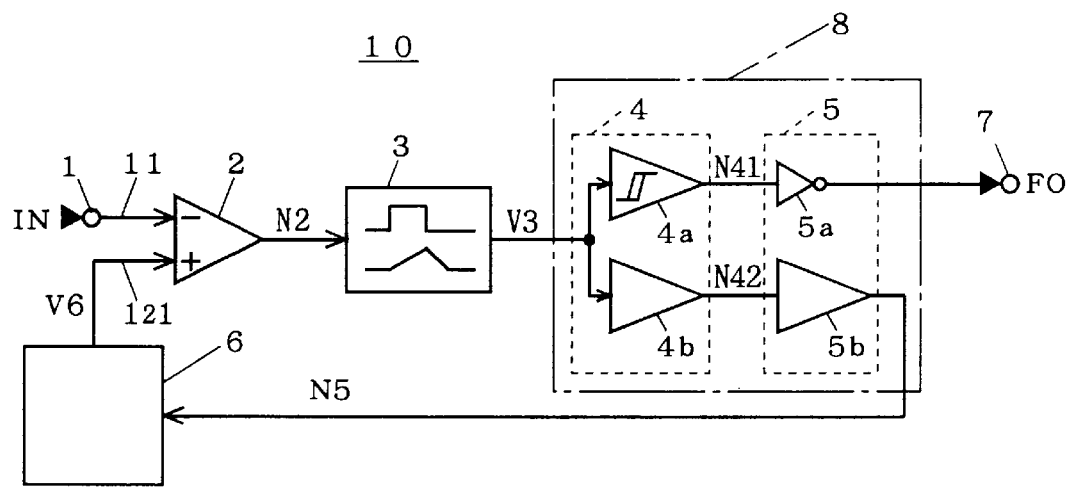
FIG. 2 is a diagram showing a structure of a voltage monitoring apparatus according to a first preferred embodiment of the present invention.

FIG. 2 is a diagram showing an example of a structure of such a voltage monitoring circuit. The circuit which is shown in FIG. 2 is different in structure from the circuit which is shown in FIG. 8 only in an integrating circuit 3, a comparison circuit 4 and a control circuit 5, and is otherwise the same. A method of monitoring a drop in the d.c. voltage in the apparatus which is shown in FIG. 2 is basically the same as that shown in FIG. 8. When a decrease in a level of the d.c. voltage input signal is created instantaneously due to a noise in the power source, etc., a hysteresis operation is prohibited, and therefore, the detect signal is not provided to outside. Only when the level of the d.c. voltage input signal remains lower than a level of a reference voltage signal during or over a predetermined period of time (which is a second period T2 in this embodiment), the apparatus performs a hysteresis operation. However, in the apparatus, as described later, the detect signal is outputted only after a third period T3 since the timing of the hysteresis operation.

In FIG. 2, one end of a first input signal line 11 is connected to a first input terminal (−) of a (first) comparison circuit 2 through an input terminal 1, so that the signal line 11 conveys an external d.c. voltage as the d.c. voltage input signal (first input signal) IN. One end of a second input signal line 12 is connected to a second input terminal (+) of the comparison circuit 2, while the other end of the second input signal line 12 is connected to an output terminal of a reference voltage generating circuit 6, so that the signal line 12 provides the comparison circuit 2 with a reference voltage as a reference voltage signal (second input signal) V6.

When the d.c. voltage allowed by the d.c. voltage input signal IN is equal to or larger than the reference voltage, the comparison circuit 2 outputs an output signal N2 having a first level (which is an L level in this embodiment) at the output terminal of the comparison circuit 2. On the other hand, when (d.c. voltage)<(reference voltage), the circuit 2 outputs the output signal N2 having a second level (which is an H level in this embodiment).

The integrating circuit 3 executed integrating in accordance with the level of the output signal N2 outputted from the comparison circuit 2. That is, when receiving the output signal N2 having the first level, the circuit 3 is in a state of integrating in a negative direction so that a level of an output signal V3 from the circuit 3 is a constant minimum potential. In other words, in substance, the circuit 3 does not start integrating. Conversely, upon receipt of the output signal N2 having the second level, the circuit 3 starts integrating. The circuit 3 keeps integrating as far as the output signal N2 having the second level is being received. After a first period of time (T1 in FIG. 5C) which is determined by an integrating coefficient or a time constant since the start of the integrating, the circuit 3 clamps the increasing output signal V3 at a predetermined clamp level. Upon returning of the level of the output signal N2 to the first level again after the clamping or during the continued integrating, the integrating circuit 3 starts decreasing the output signal V3. The integrating circuit 3 is typically formed by an RC circuit.

The (second) comparison circuit 4 and the control or logic circuit 5 form a control signal/detect signal generating circuit 8 which generates and outputs a control signal N5 and the detect signal FO. An input terminal of the comparison circuit 4 (i.e., comparators 4a, 4b) serves as an input terminal of the circuit 8, an output terminal of an inverter 5a or an output terminal 7 serves as a second output terminal of the circuit 8, while an output terminal of a buffer 5b serves as a first output terminal of the circuit 8.

First, the comparison circuit 4 compares the output signal V3 from the integrating circuit 3 with a reference level which has set levels of three values.

The comparison circuit 4 comprises the two comparators 4a, 4b. The second comparator 4a is formed by a Schmidt circuit or a Schmidt trigger circuit. The second comparator 4a will be hereinafter referred to as a Schmidt buffer. The Schmidt buffer 4a has an upper limit threshold value, i.e., a second judgement reference voltage V2H (See FIG. 5C), and a lower limit threshold value, i.e., a third judgement reference voltage V2L (See FIG. 5C). On the other hand, the first comparator 4b is a buffer circuit whose threshold value, namely, a first judgement reference voltage V2M (See FIG. 5C) is a value between the two threshold values V2H and V2L of the Schmidt buffer 4a. The first comparator 4b will be hereinafter referred to as a buffer. The threshold values V2M, V2H and V2L will be hereinafter referred to as "first set level," "second set level" and "third set level, " respectively.

An important set-up condition is that a level difference defined as (V2H−V2M) must be set in advance to be larger than a level which corresponds to a responsive time of the control circuit 5, the reference voltage generating circuit 6 or the like, particularly, a responsive time of the circuit 6, that is, time which is necessary for the circuit 6 to change a level of the reference voltage signal V6 to a corresponding level in accordance with a change in the level of the control signal N5. In the time charts shown in FIGS. 5A to 5G, the set-up condition is a relationship that (first period T1)>(second period T2+third period T3) and (third period T3)>(response time needed for setting of level of reference voltage (fifth level→sixth level). Meanwhile, it is not necessary to set a level difference (V2M−V2L) to be equal to the level difference (V2H−V2M). This is true with the third period T3 and a fifth period T5 in FIGS. 5A to 5G.

On the other hand, the second period T2 shown in FIGS. 5C and 5E is determined by a difference between the first set level V2M and a level of the output signal V3 from the integrating circuit 3 which is in a state of integrating in the negative direction. As a result, as described later, the integrating circuit 3 and the comparison circuit 4 function as a filtering circuit or a timer circuit which extracts only a voltage drop which needs to be detected but other instantaneous d.c. voltage drops which are created by a power source noise or the like. In a similar manner, a fourth period T4 shown in FIG. 5D is determined by a difference between a level of the output signal V3 from the integrating circuit 3 at a time t4 when the d.c. voltage input signal IN recovers to the reference voltage of a sixth level (which is a VH level in this embodiment) and the first set level V2M.

As a result, the circuits 3 and 4 again function as a timer circuit for a hysteresis operation which returns the level of the reference voltage of the comparison circuit 2 to the fifth level (which is a VL level in this embodiment).

The control circuit 5 is formed by the inverter 5a and the buffer 5b. In accordance with output signals N41, N42 from the comparison circuit 4, the control circuit 5 generates and outputs the control signal N5 which controls the set level of the comparison circuit 2 and the detect signal FO which externally indicates a change in a condition of the apparatus 10. The buffer 5b may not be necessarily required.

The reference voltage generating circuit 6 changes the set level of the comparison circuit 2 in accordance with an input level of the control signal N5. That is, the circuit 6 sets the level of the reference voltage signal V6 to the fifth level (which is the VL level in this embodiment) upon receipt of the control signal N5 which has a third level (which is the L level in this embodiment), while the circuit 6 sets the level of the reference voltage signal V6 to the higher sixth level (which is the VH level in this embodiment) upon receipt of the control signal N5 which has a fourth level (which is the H level in this embodiment).

Figure 3:
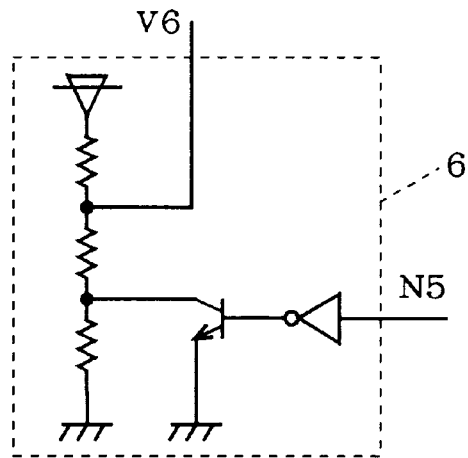
FIGS. 3 and 4 are diagrams showing an example of a structure of a reference voltage generating circuit.
Figure 4:
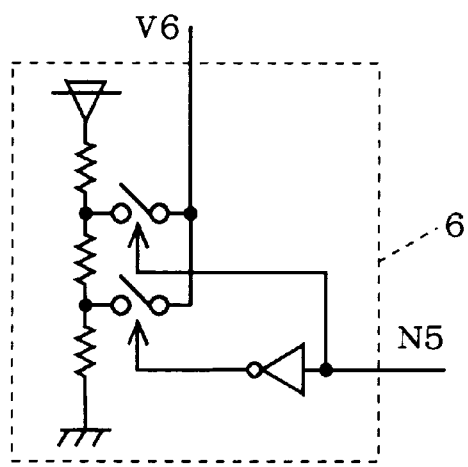

A specific structure of the reference voltage generating circuit 6 may be a structure as that shown in FIG. 3 or FIG. 4, for example.

In this embodiment, in the comparison circuit 4, a voltage set value of the Schmidt buffer 4a, namely, the second set level V2H is higher than a voltage set value (first set level) V2M of the buffer 4b, and therefore, the output signal N41 from the Schmidt buffer 4a is activated with a delay of the third period T3 (See FIGS. 5E and 5F) from the output signal N42 from the buffer 4b. This allows the detect signal FO to be detected after the set value of the reference voltage of the comparison circuit 2 is switched, so that the voltage monitoring circuit 10 outputs the detect signal FO after steadily and stably performing a hysteresis operation even without chattering of the detect signal FO. This advantage will be described in more detail with reference to the timing charts shown in FIGS. 5A to 5G.

First, the d.c. voltage input signal IN starts decreasing, and arrives at the reference voltage VL (fifth level) at a time t1. Upon the arrival, the comparison circuit 2 raises the output signal N2 from the L level (first level) to the H level (second level). Upon the raise, the integrating circuit 3 starts integrating at the time t1, so that a level of the output signal V3 from the integrating circuit 3 starts increasing. In FIG. 5A, a voltage drop in the input signal IN is a condition which is to be externally detected, so that at a time t2 after the second period T2, the increasing level of the output signal V3 arrives at the first set level V2M of the buffer 4b. At this timing, the buffer 4b raises the output signal N42 from the L level to the H level. In response to this, the buffer 5b raises the control signal N5 from the L level (third level) to the H level (fourth level). Although a response time of the buffer 5b is also a consideration in a strict sense, the response time of the buffer 5b is set to be negligibly small. At this timing (t2), the output signal N41 from the Schmidt buffer 4a is maintained at the L level, and therefore, the detect signal FO is not detected. After this, during the response time of the reference voltage generating circuit 6 which is shorten than the third period T3, the reference voltage generating circuit 6 changes a level of the reference voltage to the VH level (sixth level). For convenience of illustration, FIG. 5A omits this response time. The output signal V3 from the integrating circuit 3 keeps increasing even after the third period T3 since the time t2, and further, since the level of the output signal V3 reaches the second set level V2H of the Schmidt buffer 4a, the output signal N41 from the buffer 4a rises to the H level. In response to this, the inverter 5a starts outputting the detect signal FO. In this case, since a hysteresis operation is completed and V2H>V2M holds, there is no possibility at all that chattering of the detect signal FO will be creased.

The example in FIG. 5C shows a situation where the d.c. voltage input signal IN increases beyond the sixth level (VH) of the reference voltage before the output signal V3 is clamped. As this occurs (time t4), since the output signal N2 falls to the L level (first level) again, the integrating circuit 3 stops integrating so that the output signal V3 starts to decrease (which is discharging in the case of an RC circuit). As the output signal V3 returns to the first set level V2M again after the fourth period (i.e., at a time t5), the output signal N42, and hence, the control signal N5 falls to the L level (third level). After a predetermined response time, a level of the reference voltage signal V6 returns to the fifth level (VL), whereby a hysteresis operation with the decreasing output signal V3 is completed. Further, after the fifth period T5 (i.e., at a time t6), the decreasing output signal V3 arrives at the third set level V2L, so that inversion of the output signal N41 occurs and outputting of the detect signal FO accordingly stops. Following this, the output signal V3 returns to the minimum level which is set for integrating in the negative direction.

As described above in detail, the voltage monitoring circuit 10 shown in FIG. 2 outputs the detect signal FO to outside after internally completing the hysteresis operation without fail in a stable manner, without causing chattering of the detect signal FO.

Further, since the Schmidt buffer 4a and the buffer 4b form the comparison circuit 4, the apparatus is formed as an IC of a small size.

Second Preferred Embodiment

FIG. 6 is a block diagram showing an example of a circuitry structure of a voltage monitoring apparatus according to a second preferred embodiment of the present invention. The circuit which is shown in FIG. 6 is different in structure from the circuit which is shown in FIG. 2 only in a comparison circuit 4A and a control circuit 5A, and is otherwise the same as the circuit which is shown in FIG. 2. Of course, the reference voltage generating circuit 6 shown in FIG. 6 may have a structure as that shown in FIG. 4.

The comparison circuit 4A has predetermined two set levels (V2L, V2M) as reference levels. Comparing the output signal V3 from the integrating circuit 3 with the respective reference levels, the comparison circuit 4A generates a tertiary judgement value. The control circuit 5A generates and outputs the control signal N5 which controls the set level of the comparison circuit 2 and the detect signal FO, in accordance with a result obtained from the comparison circuit 4A.

The comparison circuit 4A which has the two voltage set values V2L (first set level) and V2H (second set level) is formed by an inverter 4d (first comparator) and a buffer 4c (second comparator) whose threshold values are these respective set levels. Although it is possible to form the comparison circuit 4A using a differential amplifier, from a viewpoint of suppressing a cost increase, the comparison circuit 4A is formed by the buffer 4c and the inverter 4d both composed of a CMOS transistor in this embodiment.

An important point in this embodiment as well is that V2H>V2L holds and that a level difference (V2H−V2L) is set in advance to be larger than a level which corresponds to a responsive time which is necessary to change a level of the reference voltage. Hence, with respect to first to fifth periods T1 to T5 shown in FIGS. 7A to 7H which will be described later, T1>(T2+T3) and T1>(T4+T5) hold. However, T2 =T4 and T3 =T5 in the circuit which is shown in FIG. 6.

The control circuit 5A is formed by a flip-flop circuit 5c which receives the output signal N41 as a set signal and the output signal N42 as a reset signal and other two logic circuit elements 5d and 5e.

FIGS. 7A to 7H are timing charts showing an operation of the circuit which is shown in FIG. 6. As shown in FIGS. 7A to 7H, the tertiary judgement value is outputted in accordance with the output signals N41 and N42 from the comparison circuit 4A which compares using the first set level V2L and the second set level V2H as the respective reference levels In this circuit as well, the control circuit 5A operates at the timing shown in FIGS. 7A to 7H (time t2), and after the reference voltage generating circuit 6 switches a level of the reference voltage from the fifth level VL to the sixth level VH in response to outputting of the control signal N5 which has the sixth level (H level), at a time t3 after the third period T3, the control circuit 5A outputs the detect signal FO. This allows the detect signal FO which indicates a change in a condition to be detected after the hysteresis operation is performed without fail, and therefore, prevent chattering of the detect signal FO.

Of course, in the circuit which is shown in FIG. 6 as well, the comparison circuit 4A is formed by the inverter 4d and the buffer 4c, and therefore, the apparatus is formed as an IC of a small size.

<Digest>

As can be understood from the description above regarding the preferred embodiments, the control signal/detect signal generating circuits 8, 8A shown in FIGS. 2 and 6 function as a timer circuit or a filtering circuit, in relation to the first period and the integrating coefficient (or the time constant) of the integrating circuit 3. With respect to the operation of the circuits 8, 8A during a period in which the d.c. voltage increases to or beyond a level of the reference voltage of the comparison circuit 2 after a hysteresis operation (i.e., to or beyond the sixth level), the circuits 8, 8A are characterized to have the following functional structure. That is, (a) the circuits 8, 8A output the control signal having the third level at the respective first output terminals when the output signal from the integrating circuit is not supplied, (b) when the output signal from the integrating circuit is received, if the circuits 8, 8A do not detect an increase in the output signal after the second period since the receipt of the output signal, the circuits 8, 8A keep outputting the control signal having the third level at the respective first output terminals, but output the control signal having the fourth level at the respective first output terminals upon detection of an increase in the output signal after the second period since the receipt of the output signal, (c) only if the circuits 8, 8A detect an increase in the output signal from the integrating circuit even after the third period since the second period, the circuits 8, 8A output the detect signal, which indicates a decrease in the d.c. voltage as information to outside, at the respective second output terminals. However, (first period)>(second period+third period) and (third period)>(response time of reference voltage generating circuit) hold.

When diversely characterizing the functions of the circuits 8, 8A in terms of threshold value, the circuits 8, 8A are summarized as follows. That is, (a) the circuits 8, 8A output the control signal having the third level when the output signal from the integrating circuit is lower than the first set level, (b) the circuits 8, 8A output the control signal having the fourth level when the output signal from the integrating circuit becomes equal to the first set level, (c) the circuits 8, 8A output the detect signal, which indicates a decrease in the d.c. voltage as information to outside, when the output signal from the integrating circuit becomes equal to the second set level. However, (predetermined level)>(second set level) >(first set level) and (second set level−first set level)≧(level corresponding to response time of reference voltage generating circuit) hold.

As a modification of the first and the second preferred embodiments, the integrating circuit 3 shown in FIGS. 2 and 6 may be formed as an integrating circuit 3P which is shown in FIG. 8. In this case, the integrating circuit starts integrating upon receipt of the output signal having the second level from the comparison circuit 2. Following this, receiving a change in the output signal from the comparison circuit 2 from the second level to the first level as a reset signal, the integrating circuit changes its output to the minimum level which is set at the start of the integrating. In this structure as well, as in FIGS. 2 and 6, a hysteresis operation is performed without fail after and in accordance with detection of a drop in the d.c. voltage beyond the reference voltage level of the comparison circuit 2 during or over the second period, and the detect signal is outputted stably without causing chattering of the detect signal.

The structures of the logic circuits of the control circuits 5, 5A shown in FIGS. 2 and 6 may be other various structures.

Further, the voltage monitoring apparatus according to the present invention is not limited to an application for a semiconductor device as shown in FIG. 1, but can be used as an apparatus for monitoring a change in a d.c. voltage for use in other various apparatuses.

With respect to each one of the set (first level, second level), the set (third level, fourth level) and the set (fifth level, sixth level) described above, the two levels in each set are in such a relationship that one level is defined as the L level if the other level is defined as the H level and vice versa.

While the invention has been described in detail, the foregoing description is in all aspects illustrative and not restrictive. It is understood that numerous other modifications and variations can be devised without departing from the scope of the invention.

We claim:

1. A voltage monitoring apparatus which has a hysteresis characteristic, comprising:
    a comparison circuit comparing a d.c. voltage supplied from outside with a reference voltage, said comparison circuit outputting an output signal of a first level when said d.c. voltage is equal to or higher than said reference voltage, said comparison circuit outputting said output signal of a second level when said d.c. voltage is lower than said reference voltage;
    an integrating circuit which starts integrating when said comparison circuit starts outputting said output signal of said second level, keeps integrating as long as said comparison circuit outputs said output signal of said second level, and clamps an output signal of said integrating circuit which is in the process of increasing at a predetermined level;
    a control signal/detect signal generating circuit having at least a first set level and a second set level as reference levels, said control signal/detect signal generating circuit comparing said output signal from said integrating circuit which is in the process of increasing with said reference levels, and outputting a control signal of a third level (a) when said output signal from said integrating circuit is smaller than said first set level, outputting said control signal of a fourth level (b) when said output signal from said integrating circuit becomes equal to said first set level, outputting a detect signal which indicates a decrease in said d.c. voltage as information to outside (c) when said output signal from said integrating circuit becomes equal to said second set level; and
    a reference voltage generating circuit receiving said control signal, said reference voltage generating circuit keeping a level of said reference voltage set to a fifth level upon receipt of said control signal of said third level, said reference voltage generating circuit setting said level of said reference voltage to a sixth level which is higher than said fifth level upon receipt of said control signal of said fourth level;
    wherein a relationship (said predetermined level)>(said second set level) >(said first set level) and a relationship (said second set level−said first set level) ≧(a level corresponding to a response time of said reference voltage generating circuit) hold.

2. The voltage monitoring apparatus of claim 1, wherein said control signal/detect signal generating circuit comprises:
    a first comparator whose input terminal is connected to an output terminal of said integrating circuit, said first comparator having said first set level as a judgement reference voltage, said first comparator comparing said output signal from said integrating circuit with said first set level;
    a second comparator whose input terminal is connected to an output terminal of said integrating circuit, said second comparator having said second set level as a judgement reference voltage, said second comparator comparing said output signal from said integrating circuit with said second set level; and
    a logic circuit whose input terminal is connected to an output terminal of said first comparator and an output terminal of said second comparator, said logic circuit generating and outputting said control signal and said detect signal based on output signals from said first comparator and said second comparator.

3. The voltage monitoring apparatus of claim 2, wherein said second comparator comprises:
    a Schmidt circuit which has said second set level and a third set level which is lower than said first set level as said judgement reference voltage; and
    said logic circuit outputs said detect signal based on said output signal from said first comparator but outputs said control signal based on said output signal from said second comparator.

4. The voltage monitoring apparatus of claim 2, wherein said logic circuit changes a level of said control signal from said fourth level to said third level when said output signal from said integrating circuit, which starts decreasing when said d.c. voltage becomes equal to said reference voltage which is set to said sixth level, becomes equal to said second level, and stops outputting said detect signal when said output signal from said integrating circuit which further keeps decreasing becomes equal to said first set level.

5. A voltage monitoring apparatus which has a hysteresis characteristic, comprising:
    a first input signal line which transmits a d.c. voltage supplied from outside as a first input signal;
    a second input signal line which transmits a reference voltage as a second input signal;
    a comparison circuit whose input terminal is connected to one ends of said first input signal line and said second input signal line, said comparison circuit outputting an output signal of a first level at an output terminal of said comparison circuit when said d.c. voltage is equal to or higher than said reference voltage, said comparison circuit outputting said output signal of a second level at said output terminal of said comparison circuit when said d.c. voltage is lower than said reference voltage;
    an integrating circuit which starts an integrating operation when said comparison circuit starts outputting said output signal of said second level, said integrating circuit keeps executing said integrating operation while said comparison circuit keeps outputting said output signal of said second level, said integrating circuit clamping an output signal of said integrating circuit which is in the process of increasing at a predetermined level after a first period since the start of said integrating operation;

a control signal/detect signal generating circuit whose input terminal is connected to an output terminal of said integrating circuit, (a) said control signal/detect signal generating circuit outputting a control signal of a third level at a first output terminal of said control signal/detect signal generating circuit when said output signal of said integrating circuit is not received, (b) upon receipt of said output signal of said integrating circuit, said control signal/detect signal generating circuit continuing to output said control signal of said third level at said first output terminal when an increase in said output signal of said integrating circuit is not detected after a second period since the receipt of said output signal of said integrating circuit, but outputting said control signal of a fourth level at said first output terminal when said increase in said output signal of said integrating circuit is detected even after said second period since the receipt of said output signal of said integrating circuit, (c) said control signal/detect signal generating circuit outputting a detect signal, which indicates a decrease in said d.c. voltage as information to outside, at a second output terminal of said control signal/detect signal generating circuit only when said increase in said output signal of said integrating circuit is detected even after a third period since said second period; and a reference voltage generating circuit whose input terminal is connected to said first output terminal of said control signal/detect signal generating circuit, an output terminal of said reference voltage generating circuit being connected to other end of said second input signal line, said reference voltage generating circuit keeping a level of said reference voltage set to a fifth level upon receipt of said control signal of said third level, said reference voltage generating circuit keeping said level of said reference voltage set to a sixth level which is higher than said fifth level upon receipt of said control signal of said fourth level;

wherein a relationship (said first period)>(said second period+said third period) and a relationship (said third period)>(a response time of said reference voltage generating circuit) hold.

6. The voltage monitoring apparatus of claim 5, wherein said control signal/detect signal generating circuit has a function of (d) changing a level of said control signal from said fourth level to said third level after a fourth period since arrival of said d.c. voltage at said reference voltage set to said sixth level, and a function of (e) stopping to output said detect signal after a fifth period since said fourth period, and a relationship (said first period)>(said fourth period+said fifth period) holds.

7. A voltage monitoring method which has a hysteresis characteristic, comprising the steps of:

comparing a d.c. voltage supplied from outside with a reference voltage having a first level;

starting an integrating operation when said d.c. voltage which is higher than said reference voltage becomes equal to said reference voltage and continuing said integrating operation until a first period, which is necessary for an integrated value to reach a predetermined level, as long as said d.c. voltage is lower than said reference voltage;

detecting whether an increase in said integrated value is continuing after a second period since the start of said integrating operation, continuing generation of a control signal of a third level as before the start of said integrating operation if said increase is not continuing, but changing a level of said control signal from said third level to fourth level if said increase is continuing;

continuing to set a level of said reference voltage to said third level when said level of said control signal is at said third level, but setting said level of said reference voltage to a second level which is higher than to said first level when said level of said control signal is at said fourth level to thereby continue comparison of said d.c. voltage supplied from outside with said reference voltage and said integrating operation in accordance with a result of said comparison; and detecting whether said increase in said integrated value is continuing even after a third period since said second period, generating a detect signal, which indicates a decrease in said d.c. voltage as information to outside, if said increase is continuing and outputting said detect signal to outside, wherein a relationship (said first period)>(said second period+said third period) and a relationship (said third period)>(a response time in which said level of said reference voltage can be set in accordance with receipt of said control signal) hold.

* * * * *